United States Patent [19]

Hatano et al.

[11] Patent Number: 5,193,075

[45] Date of Patent: Mar. 9, 1993

[54] STATIC MEMORY CONTAINING SENSE AMP AND SENSE AMP SWITCHING CIRCUIT

[75] Inventors: Susumu Hatano; Kanji Oishi; Takashi Kikuchi; Yasuhiko Saigou; Hiroshi Fukuta; Kunio Uchiyama; Hirokazu Aoki; Osamu Nishii, all of Tokyo, Japan

[73] Assignees: Hitachi Ltd.; Hitachi VLSI Engineering Corp., both of Tokyo, Japan

[21] Appl. No.: 490,745

[22] Filed: Mar. 8, 1990

[30] Foreign Application Priority Data

Mar. 8, 1989 [JP] Japan .................................. 1-55938

[51] Int. Cl.⁵ .................................................. G11C 7/00
[52] U.S. Cl. ...................................... 365/233; 365/154; 365/190
[58] Field of Search ............... 365/190, 205, 206, 207, 365/208, 154, 156, 233

[56] References Cited

U.S. PATENT DOCUMENTS

| | | | |
|---|---|---|---|
| 4,386,419 | 5/1983 | Yamamoto | 365/190 |
| 4,799,196 | 1/1989 | Takemae | 365/190 |
| 4,804,871 | 2/1989 | Walters, Jr. | 365/205 |
| 4,829,483 | 5/1989 | Ogihara | 365/205 |
| 4,831,590 | 5/1989 | Ichinose | 365/205 |
| 4,839,868 | 6/1989 | Sato et al. | 365/205 |
| 4,926,381 | 5/1990 | Fujii | 365/205 |
| 5,027,325 | 6/1991 | Katsura | 365/205 |

FOREIGN PATENT DOCUMENTS 52-21733  2/1977  Japan .
53-73039  6/1978  Japan .
57-198592  6/1982  Japan .

Primary Examiner—Joseph L. Dixon
Assistant Examiner—Michael A. Whitfield
Attorney, Agent, or Firm—Fay, Sharpe, Beall, Fagan, Minnich & McKee

[57] ABSTRACT

A static memory cell is connected with word lines and data lines. First and second switches are connected in series between a data line and an output circuit. A sense amplifier has an input/output terminal connected to a common connection point of the said first and second switches. The first switch is turned off in synchronism with commencing operation of the sense amplifier such that the parasitic capacitance of the data line as viewed from the sense amplifier decreases. The second switching means is turned on a predetermined time later in order to transmit the output signal of the sense amplifier to the output circuit.

7 Claims, 8 Drawing Sheets

STATIC MEMORY CONTAINING SENSE AMP AND SENSE AMP SWITCHING CIRCUIT

BACKGROUND OF THE INVENTION

The present invention relates to a semiconductor memory device, and particularly to art that can be effectively adapted to writing/reading data with many bits as a unit such as an address tag or data in a cache memory.

When many bits are to be simultaneously read out such as in a cache memory, it becomes necessary to provide a parity check function and an address comparison function. These functions must be carried out at high speeds and realized in a highly dense integrated form. It is further desired to shorten the rise time of the word line to the time needed for amplification of data stored in a selected memory cell by the sense amplifier; i.e, it is desired to increase the speed of reading operation. Also, by using a static memory cell, in general, it becomes possible to increase the speed of reading operation. Further, operation of the sense amplifiers has been disclosed in Japanese Patent Laid-Open Nos. 53-73039, 52-21733, 57-198592 and in Electronic Technology, Vol. 23, No. 3, 1981, pp. 31-32. Japanese Patent Laid-Open No. 53-73039 discloses an art in which the signal input gates (QN4 and QN5) for the sense amplifier are automatically rendered nonconductive simultaneously with the start of amplification by the sense amplifier. But it does not disclose any concrete constitution for reading many bits simultaneously. This prior art does not disclose any concrete operation for writing the data, either. Further, the above: Japanese Patent Laid-Open No. 52-21733, Japanese Patent Laid-Open No. 57-198592 and Electronic Technology Vol. 23, No. 3 all disclose memories having a relationship between a sense amplifier and switch means for inputting signals to the sense amplifier. The above memories, however, are all of the dynamic type.

SUMMARY OF THE INVENTION

One object of the present invention is to provide a semiconductor memory device adapted to a cache memory which exhibits many functions and is integrated very densely.

Another object of the present invention is to provide a static semiconductor memory device which is designed to carry out the reading or writing operation at high speed and to reduce the amount of electric power consumed by the device.

The above and other objects, as well as novel features of the present invention, will become obvious from the description of the specification and the accompanying drawings.

Among the possible embodiments of inventions disclosed in this application, a representative example will now be described briefly.

A parity check circuit is comprised of a plurality of unit circuits connected in cascade. Each unit circuit comprises a pair of switching MOSFETs (Q12 and Q13) that receive one output signal of the complementary output signals of a sense amplifier and a pair of MOSFETs Q14 and Q15 that receive the other output signal. These MOSFET pairs are provided to correspond to the complementary data lines to which the memory cells are connected. The nodes of the input side of the MOSFETs Q12, Q14 and Q13, Q15 are commonly connected so they can be served with a complementary level, and the nodes of the output side of the MOSFETs Q14 and Q15 are connected diagonally to the nodes of the output side of the MOSFETs Q12 and Q13. Furthermore, a unit comparator circuit that receives the stored data and signals externally fed comprises a pair of switching MOSFETs which are served with complementary output signals of a sense amplifier (corresponding to the complementary data lines to which the memory cells are connected) through the source and drain of one of the MOSFET. The comparator MOSFET is served with a comparison signal corresponding to the gate thereof, of which the source and drain of the other side are commonly connected, and an output MOSFET which is connected through the gate thereof to the above other source and drain. Further, a switching element is provided between the input/output node of the sense amplifier and the complementary data lines to which the static memory cells are coupled. When the data is read out from a memory cell, the switching element is turned off in synchronism with the start of the operation of the sense amplifier. Thereafter, the data amplified by the sense amplifier is sent to a common data line via a column switch that is provided in the succeeding stage of the sense amplifier and that is selectively turned on. When the data is to be written in the memory cell, the switching element is turned on while the sense amplifier holding the written data is in operation.

According to the aforementioned means, the parity check circuit is coupled to the input/output node of the sense amplifier to realize a large scale integration and high speed operation. Further, with the comparator circuit served with a comparison signal through the gates and the source and drain on one side of the pair of MOSFETs, it is allowed to decrease the number of elements and the wiring capacitances to accomplish high speed operation.

Furthermore, the complementary data lines having a relatively large parasitic capacitance (due to the connection of many memory cells) may be cut away by the switching element just after a signal level requiring amplification is read out. This allows one to increase the speed of operation. In this case, the column switch for selecting the complementary data lines is provided in the succeeding stage of the sense amplifier. In other words, the column switch does not exist between the complementary data lines and the sense amplifier. This helps to decrease the resistance of the signal transmission path from the complementary data lines to the input/output node of the sense amplifier, enabling the speed of reading operation to further increase. By effectively using the sense amplifier during the writing operation, one is allowed to increase the speed of the writing operation.

DESCRIPTION OF THE PREFERRED EMBODIMENTS

Figure 1:
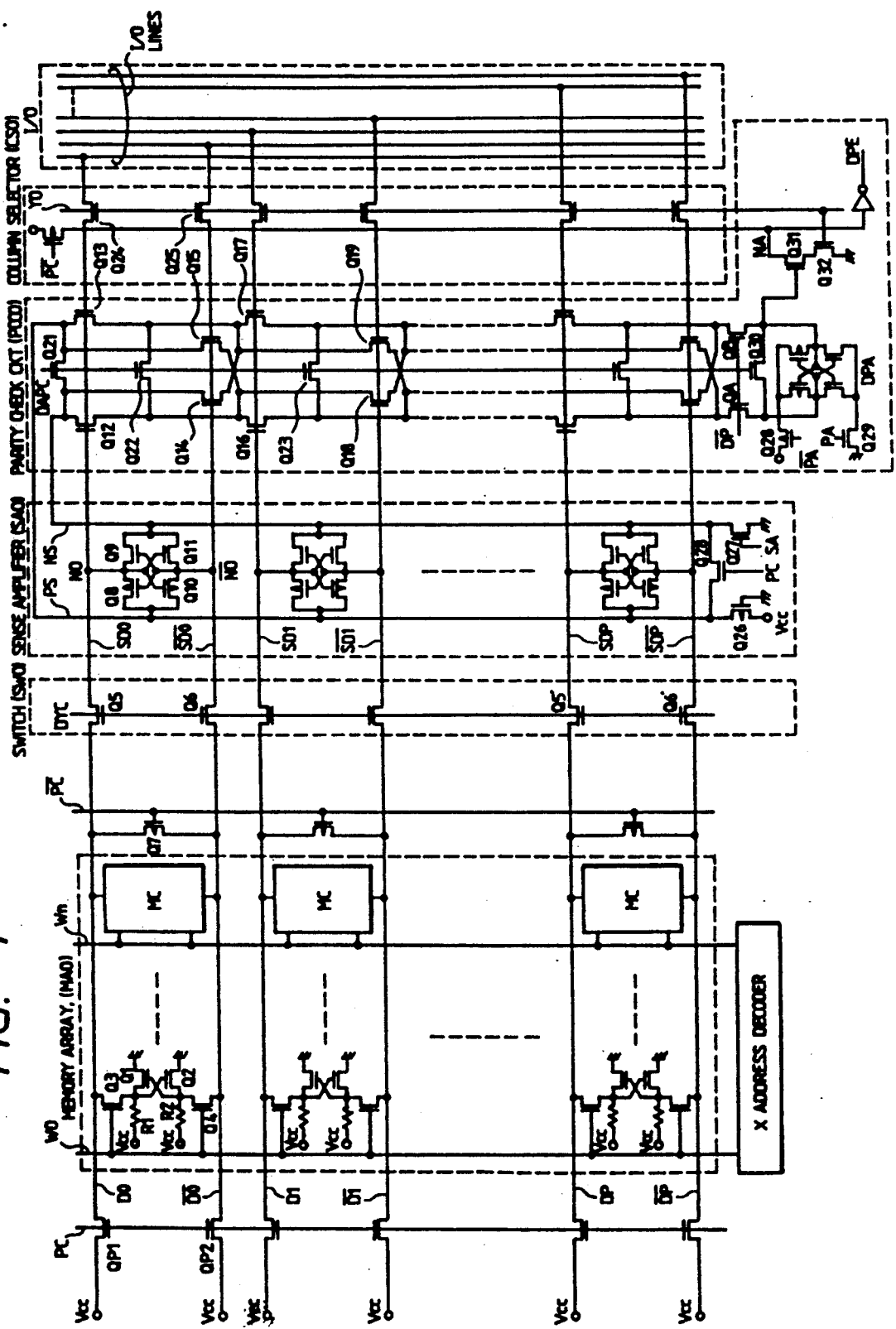
FIG. 1 is a circuit diagram illustrating an essential portion of a RAM according to an embodiment of the present invention.

FIG. 1 is a circuit diagram illustrating major portions of a static RAM which performs multibit reading/writing operations according to an embodiment of the present invention. The RAM of FIG. 1 is formed on a semiconductor substrate such as single crystalline silicon by the conventional CMOS integrated circuit technology.

Though there is no particular limitation, the integrated circuit is formed on a semiconductor substrate which consists of single crystalline n-type silicon. A p-channel MOSFET consists of: a source region, a drain region formed on the surface of the semiconductor substrate, and a gate electrode composed of polysilicon formed on the surface of the semiconductor substrate between the source region and the drain region via a thin gate insulating film. An n-channel MOSFET is formed on a p-type well region located on the surface of the semiconductor substrate. Thus, the semiconductor substrate forms a substrate gate which is common to a plurality of p-channel MOSFETs that are formed thereon. The p-type well region constitutes a substrate gate for the n-channel MOSFET that is formed thereon. In FIG. 1, a symbol of an arrow is added to the channel portion (back gate portion) to distinguish the p-channel MOSFET from the n-channel MOSFET. Further, when not specifically stated, the MOSFETs are of the n-channel type.

The memory array comprises a plurality of memory cells MC arranged in the form of a matrix shown as a representative example, word lines W0 to Wn, and complementary data lines D0, $\overline{D0}$ to DP, $\overline{DP}$.

The memory cells MC have the same circuit constitution which is illustrated as a memory cell arranged at intersecting points of the representatively shown word line W0 and complementary data lines D0, $\overline{D0}$. Thus, the memory cell includes n-channel memory MOSFETS Q1, Q2 of which the gates and drains are connected in an intersecting manner and of which the sources are connected to ground points of the circuit, and high resistance R1, R2 composed of polycrystalline silicon (polysilicon) layer provided between the drains of the MOSFETs Q1, Q2 and the power source terminal Vcc. N-channel transfer gate MOSFETs Q3 and Q4 are provided between a common connection point of the MOSFETs Q1, Q2 and the complementary data lines D0, $\overline{D0}$. Gates of the transfer gate MOSFETs Q3, Q4 and similar memory cells arranged along the same row (direction of word line) are commonly connected to the corresponding word line W0 that is representatively shown, and the input/output terminals of the memory cells arranged along the same column are connected to the corresponding pair of complementary data lines (bit lines or digit lines) that are representatively shown.

In the memory cell, the MOSFETs Q1, Q2 and the resistors R1, R2 constitute a flip-flop circuit. The resistor R1 has a large resistance such that the gate voltage of the MOSFET Q2 is maintained to be slightly higher than a threshold voltage thereof when the MOSFET Q1 is turned off. In other words, the resistors R1, R2 have resistances large enough to compensate for the drain leakage current of the MOSFETs Q1, Q2. The resistors R1, R2 have a current feeding ability which prevents the data charge stored in the gate capacitance (not shown) of the MOSFET Q2 from being discharged. This makes it possible to decrease the electric power consumed by the memory cells.

According to this embodiment, despite the fact that most RAMs are produced by the CMOS-IC technology, the memory cells MC here are constituted with n-channel MOSFETs and polysilicon resistance elements as mentioned above.

The memory cells and memory array according to this embodiment which uses polysilicon resistor elements occupy reduced areas on the chip when compared with the case where the p-channel MOSFETs are used. That is, when the polysilicon resistor is used, the polysilicon resistor can be formed on the gate electrode of the drive MOSFET Q1 or Q2, and its size can be reduced. Moreover, no wasteful blank is formed since there is no need of maintaining a relatively large distance from the drive MOSFETs Q1, Q2 unlike when the p-channel MOSFETs are used.

In FIG. 1, though there is no particular limitation, the signals of complementary data lines D0, $\overline{D0}$ are transferred to the input/output nodes N0, $\overline{N0}$ of a sense amplifier (in the form of a CMOS latch) via switching MOSFETs Q5, Q6. The complementary data lines SD0, $\overline{SD0}$ having the input/output nodes, N0, $\overline{N0}$ are isolated by the switching MOSFETs Q5, Q6 from the complementary data lines D0, $\overline{D0}$ which connect to the memory cells. In order to distinguish them from each other, therefore, the complementary data lines to which the input/output nodes N0, $\overline{N0}$ pertain are hereinafter referred to as subcomplementary data lines SD0, $\overline{SD0}$. The sense amplifier (in the form of a CMOS latch) is constituted by intersecting the inputs and outputs of the CMOS inverter circuits that are constituted by p-channel MOSFETs Q8, Q10 and by n-channel MOSFETs Q9, Q11, respectively. Sense amplifiers are also connected, via switching MOSFETs similar to Q5', Q6', with other complementary data lines D1, $\overline{D1}$ to DP, $\overline{DP}$ that are representatively shown.

The following description deals chiefly with a circuit constitution connected to the complementary data lines D0, $\overline{D0}$. The circuit constitutions connected to other complementary data lines D1, $\overline{D1}$ to DP, $\overline{DP}$ are the same as the above constitution.

Sources of the p-channel MOSFETs Q8, Q10 constituting the sense amplifier are connected to a common source line PS which is served with an operation voltage via a MOSFET Q26. Though there is not particular limitation, the MOSFET Q26 is ordinarily served with ground potential through the gate thereof and is ordinarily rendered conductive.

Sources of the n-channel MOSFETs Q9, Q11 constituting the sense amplifier are connected to a common source line NS which is served with ground potential of the circuit via an n-channel MOSFET Q27 that receives a timing pulse SA for activating the sense amplifier.

When the timing pulse SA assumes the high level to render the n-channel MOSFET Q27 conductive, the sense amplifier is served with the operation current which is necessary for the amplification operation. That is, the sense amplifier starts to amplify the signals transmitted via the complementary data lines DO, $\overline{DO}$ and the switching MOSFETs Q5, Q6.

A p-channel switching MOSFET Q7 that receives a precharge signal PC is provided between the complementary data lines, i.e., between the data lines DO and $\overline{DO}$. The switching MOSFET Q7 is turned on during the precharging operation. The precharge current is supplied to the complementary data lines DO, $\overline{DO}$ via p-channel MOSFETs Q8, Q10 constituting the sense amplifier and via the p-channel MOSFET Q26. The switching MOSFET Q7 is provided in order to equalize the precharged levels of the data lines DO and $\overline{DO}$. Thus, since the precharge circuit is constituted by utilizing p-channel MOSFETs of the sense amplifier, there is no need of separately providing a circuit for only precharging. It is also allowable to provide precharge MOSFETs QP1, QP2 to supply the power source voltage Vcc to the complementary data lines DO, $\overline{DO}$ to DP, $\overline{DP}$.

A timing pulse DYC is supplied to the gates of switching MOSFETs Q5 and Q6 which are provided between the complementary data lines DO, $\overline{DO}$ and between the corresponding subcomplementary data lines SDO, $\overline{SDO}$.

Figure 5:
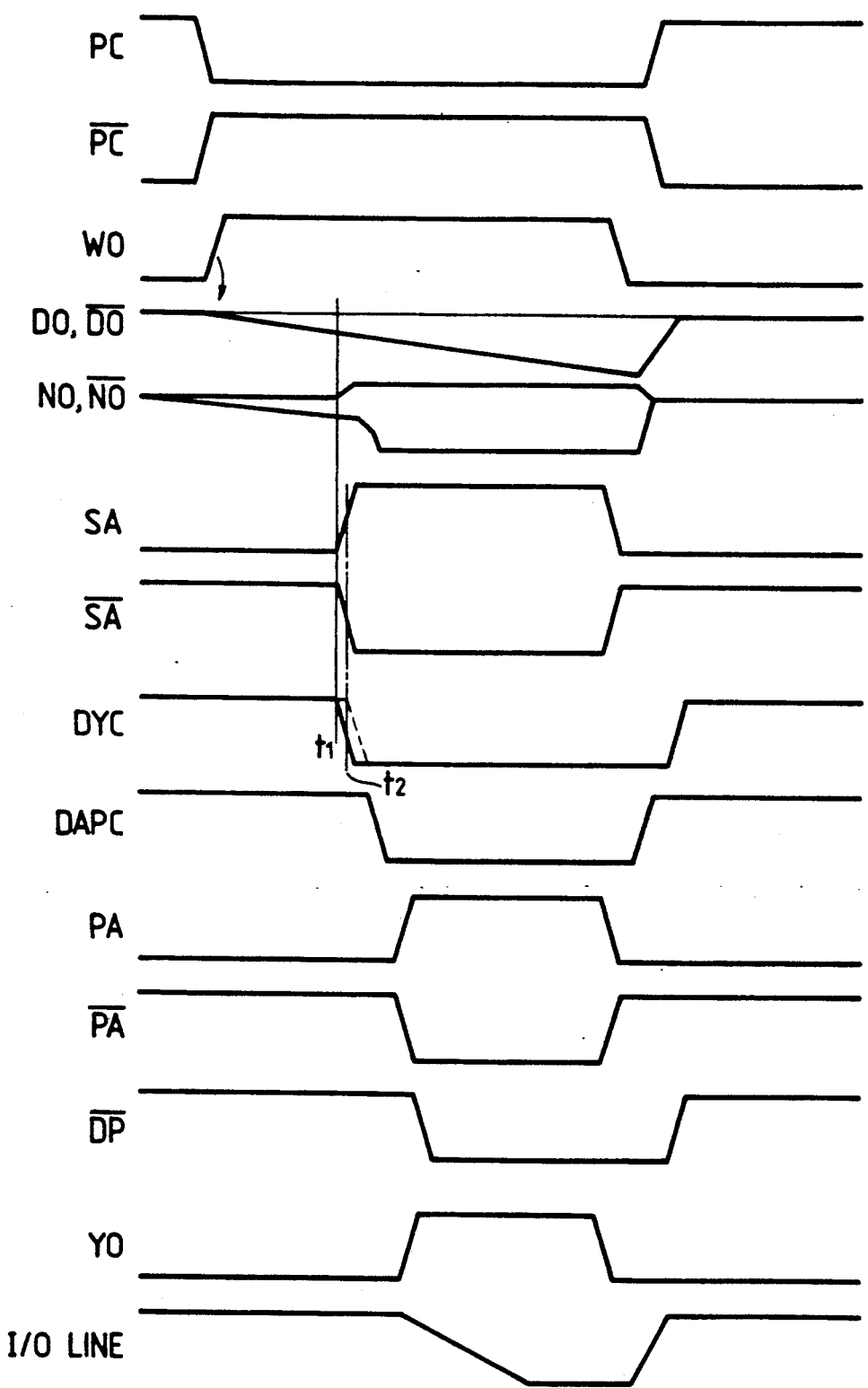
FIG. 5 is a timing diagram for explaining the reading operation of the embodiments of FIGS. 1 to 4.

As shown in an operation timing diagram of FIG. 5, the timing pulse DYC starts to change from a high level into a low level at a moment $t_1$. When a word line WO of the memory array assumes the high level, the data stored in memory cell is read out onto the complementary data lines DO, $\overline{DO}$, and a signal quantity requiring the amplification operation of the sense amplifier is produced on the nodes NO, $\overline{NO}$. In synchronism therewith, a timing pulse SA (for activating the sense amplifier) changes from the low level into the high level. Due to a change of the timing pulse DYC into a low level, the switching MOSFETs Q5, Q6 are turned off, and the complementary data lines DO, $\overline{DO}$ and the subcomplementary data lines SDO, $\overline{SDO}$ are separated from each other. Therefore, the load on the complementary data lines decreases as viewed from the sense amplifier enabling the signal transmitted onto the nodes NO, $\overline{NO}$ to be amplified at high speeds. This sense operation is continued with the sense amp disconnected from the memory cells and the I/O lines, as indicated in FIG. 5, from the time $t_1$ to a time $t_3$. At $t_3$, the line YO is closed to convey the signal to the I/O line.

Traditionally, the above-mentioned memory cells are numerously connected to the complementary data lines DO, $\overline{DO}$ forming a relatively large parasitic capacitance. In this embodiment, on the other hand, the complementary data lines DO, $\overline{DO}$ having large parasitic capacities, are cut off at the commencement of sense amplifier operation. Therefore, the high and low levels whose differences are very small are transmitted to the input/output nodes NO, $\overline{NO}$, and can be amplified by the sense amplifier of the type of CMOS latching at a high speed, respectively resulting in the high level such as the power source voltage Vcc, and the low level such as ground potential of the circuit. Owing to such a change in the level at such high speeds, suppression of through current generation that flows through the p-channel MOSFET and the n-channel MOSFET constituting the CMOS inverter circuit is allowed, and high-speed operation is accomplished while still decreasing the consumption of electric power.

The memory cells are of the static type and do not require the rewriting (refresh) operation unlike the dynamic memory cells. Therefore, the data holding operation of the memory cells is not at all affected even when the input/output nodes NO, $\overline{NO}$ of the sense amplifier are cut off from the complementary data lines DO, $\overline{DO}$ to which the memory cells are coupled. This greatly differs from the amplification operation of the shared-type sense amplifier provided for the dynamic memory cells.

Here, as indicated by a dotted line FIG. 5, the time $t_1$ at which the timing pulse DYC changes from the high level into the low level may be delayed to a time $t_2$. By delaying the time of change, the switching MOSFETs Q5 and Q6 can be maintained conductive for a predetermined period of time after the amplification operation of the sense amplifier has started. By suitably setting this period, it is possible to decrease the coupling noise that generates at the nodes NO, $\overline{NO}$ when the sense amplifier is driven without restricting the speed of operation of the sense amplifier. That is, when the sense amplifier is started, coupling noise tends to generate at the nodes NO, $\overline{NO}$ as the common source line NS quickly breaks from the high level into the low level. As the coupling noise adversely affects the microsignal transmitted from the memory cell to the nodes NO, $\overline{NO}$, it becomes difficult to correctly detect the microsignals by the sense amplifier. As a result, erroneous operation such as erroneous reading takes place easily. The coupling noise develops less at the nodes NO, $\overline{NO}$ with an increase in the parasitic capacity coupled to the nodes NO, $\overline{NO}$. According to the embodiment indicated by the dotted line in FIG. 5, the parasitic capacity coupled to the nodes NO, $\overline{NO}$ includes the parasitic capacities of the complementary data lines DO, $\overline{DO}$ at the time t1 when the sense amplifier is started and during the subsequent predetermined period of time t1–t2. Therefore, erroneous operation is prevented when compared with the embodiment indicated by a solid line in FIG. 5.

The word lines WO to Wn shown in FIG. 1 are selected by an output signal of the X-address decoder circuit.

Unit circuits corresponding to the word lines of the X-address decoder circuit are constituted by similar NOR gate circuits. To the input terminals of the NOR gate circuits are applied internal complementary address signals consisting of a plurality of bits in predetermined combinations. Therefore, a word line of which the address is designated is selectively operated.

The subcomplementary data lines SDO, $\overline{SDO}$ that are representatively shown are coupled to common I/O lines via switching MOSFETs Q24, Q25 which constitute a column selector that is controlled by a column decoder that is not shown.

The input/output circuit (I/O) includes the common I/O lines as well as the data input buffers and data output buffers (not shown). The data output buffer includes a main amplifier for amplifying the read signals and an output circuit.

Figure 6:
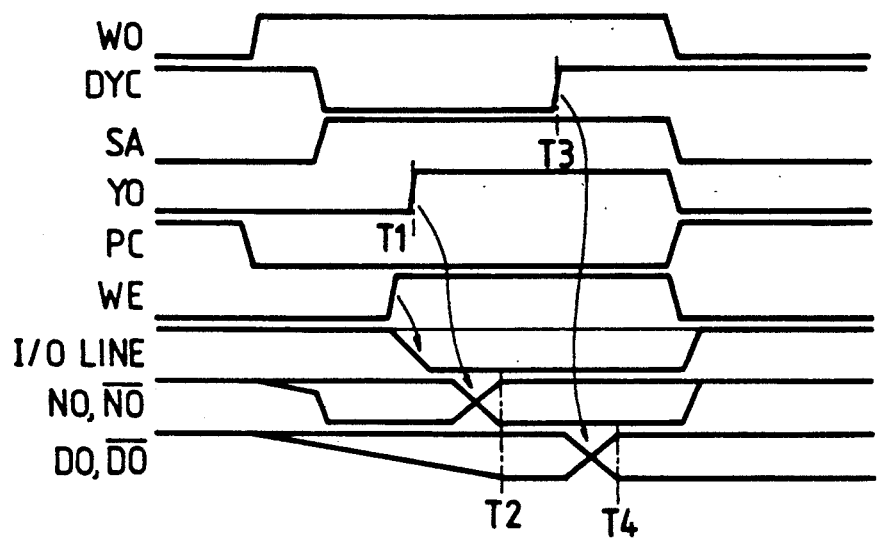
FIG. 6 is a timing diagram for explaining the writing operation of the embodiments of FIGS. 1 to 4.

FIG. 6 is a diagram of timing waveforms during the writing operation. Symbols of the waveforms correspond to those of FIG. 1. Symbol WE denotes a control signal of the write circuit for supplying write data to the I/O line. Though not diagramed in FIG. 1, the write circuit is coupled to the I/O line. According to this embodiment, the capacitive load becomes small as viewed from the write circuit to increase the speed of operation for simultaneously writing many bits. That is, the write signal sent from the write circuit is fed to subcomplementary data lines (SDO, $\overline{SDO}$ to SDP, $\overline{SDP}$) via I/O line and column selector. At this moment, however, the complementary data lines (DO, $\overline{DO}$ to DP, $\overline{DP}$) have been isolated from the subcomplementary data lines (SDO, $\overline{SDO}$ to SDP, $\overline{SDP}$) by the switches that are turned off by the control signal DYC. When the subcomplementary data lines (SDO, $\overline{SDO}$ to SDP, $\overline{SDP}$) are driven by the write circuit, therefore, their speed of operation is not affected by the parasitic capacities of the complementary data lines (DO, $\overline{DO}$ to DP, $\overline{DP}$). Therefore, the period is short from a moment (T1) when the column selector is turned on to a moment (T2) when the write signal is sent to the subcomplementary data lines. In this embodiment, furthermore, the complementary data lines (DO, $\overline{DO}$ to DP, $\overline{DP}$) can be driven by the sense amplifier; i.e., the complementary data lines (DO, $\overline{DO}$ to DP, $\overline{DP}$) can be driven at high speeds without the need of improving driving performance of the write circuit. That is, the period is shortened from a moment (T3) when the switch is turned on by the control signal DYC to a moment (T4) when the write signal is sent onto the complementary data lines.

For a waiting operation, DYC is disconnected before data transmission begins as indicated by T6 in FIG. 6. The sense amplifier must also be turned on as indicated by T5 in FIG. 6. Although T5 and T6 may be simultaneous as indicated in FIG. 6, no limitation is intended; either T5 or T6 may occur first so long as both occur before T1.

Figure 4:
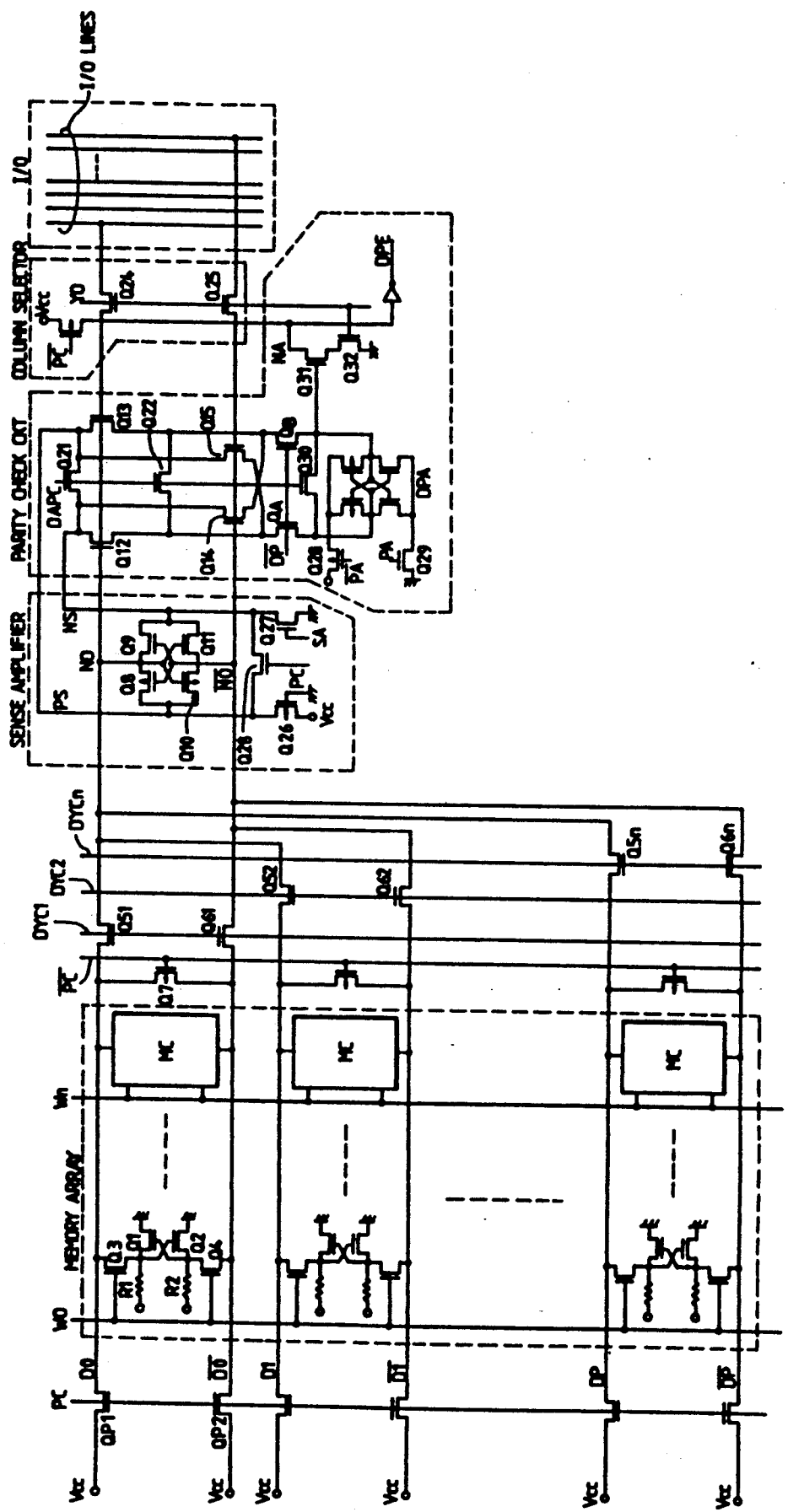
FIG. 4 is a circuit diagram illustrating an essential portion of a RAM according to a still further embodiment of the present invention.

In the embodiment shown in FIG. 1, the sense amplifier is provided for each pair of complementary data lines of the memory array. Instead of this constitution, however, it is also allowable to use the sense amplifier commonly for a plurality of pairs of complementary data lines as shown in FIG. 4. In the embodiment of FIG. 4, pairs of switching MOSFET's (Q51, Q61) to (Q5n, Q6n) are provided to correspond to the pairs of complementary data lines DO, $\overline{DO}$ to DP, $\overline{DP}$.

A writing sense operation of the voltage differences across the pair of nodes NO, $\overline{NO}$ begins in FIG. 6 at T7. The writing sense operation is continued with the sense amp disconnected from the memory cells until time T3. Pairs of switching MOSFET's are all turned on under the nonselected condition or during the precharging period (before the word lines are selected). Then, except the pairs of switching MOSFETs corresponding to a column that is to be selected, other pairs of switching MOSFET's are turned off before the word lines are selected. Hereinafter, the reading operation is carried out in the same manner as the one explained above with reference to FIG. 5.

According to the present invention as shown in FIG. 1, provision is made of a parity check circuit for checking whether a plurality of bits are read out correctly. The parity check circuit is directly connected to the input/output nodes NO, $\overline{NO}$ of the sense amplifier to increase the degree of integration and the speed of operation.

That is, provision is made of a pair of MOSFETs Q12 and Q13 of which the gates are connected to the input/output node NO corresponding to the noninverted data line DO, and another pair of MOSFETs Q14 and Q15 of which the gates are connected to the input/output node $\overline{NO}$ corresponding to the inverted data line $\overline{DO}$. A common connection point of input/output terminals on one side of MOSFETs Q12 and Q14 is connected to the common source line NS (served with ground potential that activates the sense amplifier). Also, a common connection point of input/output terminals on one side of MOSFETs Q13 and Q15 is connected to the common source line PS. PS is served with the power source voltage Vcc of the high-level side that activates the sense amplifier. The input/output terminals on the other side of MOSFETs Q14 and Q15 (of which the gates are connected to the subdata line $\overline{SDO}$ corresponding to the data line $\overline{DO}$ of the inverted side) are connected to the input/output terminals of the other side of MOSFETs Q13 and Q12 in a crossed manner.

A circuit similar to the above-mentioned circuit is also provided for the subcomplementary data lines corresponding to the complementary data lines D1, $\overline{D1}$ which are neighboring to the above-mentioned complementary data lines DO, $\overline{DO}$. That is, provision is made of a pair of MOSFETs Q16 and Q17 (of which the gates are connected to a subdata line SD1 that corresponds to a data line D1 of the noninverted side) and another pair of MOSFETs Q18 and Q19 (of which the gates are connected to a subdata line SD1 that corresponds to a data line D1 of the inverted side).

A common connection point of input/output terminals on one side of MOSFETs Q16 and Q18 is connected to a common connection point of input/output terminals on the other side of MOSFETs Q12 and Q15. A common connection point of input/output terminals on one side of MOSFETs Q17 and Q19 is connected to a common connection point of input/output terminals of the other side of MOSFETs Q13 and Q14. Thus, the similarly constituted circuits are provided for the pairs of subcomplementary data lines corresponding to other pairs of complementary data lines. Predetermined parity bits are stored in a memory cell connected to a final pair of complementary data lines DP, $\overline{DP}$. Parity bits are formed in advance by a parity bit generator (not shown). The number of "1" or "0" of a plurality of bits read out at one time will be an odd number or an even number. A circuit similar to the above-mentioned circuit is provided even for the subcomplementary data lines SDP, $\overline{SDP}$ corresponded to the complementary data lines DP, $\overline{DP}$. On the output side there is provided an amplifier circuit DPA of the form of SMOC latch similar to the aforementioned sense amplifier via switching MOSFETs QA, QB that receive a timing pulse DP. The amplifier circuit DPA is provided with a p-channel switching MOSFET Q28 and an n-channel MOSFET Q29 which receive timing pulses PA, $\overline{PA}$ and in turn feed the power source voltage (Vcc) and ground potential of the circuit.

Further, MOSFETs Q22, Q23 and Q30 for shortcircuiting (precharging) are provided between the common source lines PS and NS, and between the source and the drain on the output side of the switching MOSFETs Q12 and Q13 in the unit circuits. Q22, Q23 and Q30 are controlled for their switching operation by the timing pulses DAPC.

The parity check circuit in this embodiment operates as described below.

When a signal read out to the complementary data lines DO, $\overline{DO}$ is of the high level or, in other words, when the noninverted data line DO is in the high level and the inverted data line $\overline{DO}$ is in the low level, the MOSFETs Q12 and Q13 are turned on owing to the amplification operation of the sense amplifier. Therefore, a signal of the low level is sent to the next stage through MOSFET Q12 and a signal of the high level is sent to the next stage through MOSFET Q13.

When a signal read out to the complementary data lines D1, $\overline{D1}$ of the next stage is of the high level or, in other words, when the noninverted data line D1 is in the high level and the inverted data line $\overline{D1}$ has the low level, the MOSFETs Q16 and Q17 are turned on owing to the amplification operation of the sense amplifier. Therefore, a signal of the low level is sent to the next stage through MOSFET Q16 and a signal of the high level is sent to the next stage through MOSFET Q17. That is, the signals of the above-mentioned levels are directly transmitted. Hereinafter, when the whole bits have the high level (logic "1"), the amplifier circuit produces an output of the high level. When the whole bits inclusive of the parity bits (DP) have an odd number, an odd-number parity system is employed.

When a signal read onto the complementary data lines DO, $\overline{DO}$ has the low level or, in other words, when the noninverted data line DO has the low level and the inverted data line $\overline{DO}$ has the high level, the MOSFETs Q14 and Q15 are turned on owing to the amplification operation of the sense amplifier. Therefore, a signal of the low level is sent to the next stage through MOSFET Q14 and a signal of the high level is sent to the next stage through MOSFET Q15 in a crossing manner. Other data are all transmitted without level change when they are of the high level. Therefore, a logic "0" is written onto the parity bit and, then, the high level and the low level are inverted again such that the output signal is of the high level when viewed from the side of the amplifier DPA. When any one bit is not correct among the plurality of bits, the amplifier circuit DPA produces an output signal of the low level to turn the MOSFET Q31 off. Therefore, when the MOSFET Q32 is turned on by a select signal YO of the column selector, the output signal DPE which has passed through the inverter circuit is of the low level to display a parity error. When an even-number parity system is employed, the parity error is represented by a high level output signal (DPE), unlike the above-mentioned case.

According to this embodiment, the transfer gate MOSFETs such as MOSFET's Q12 and Q13 constituting the parity check circuit are directly connected to the subcomplementary data lines SDO, $\overline{SDO}$ to which the input/output nodes NO, $\overline{NO}$ of the sense amplifier are connected, making it possible to realize high-speed operation and high degree of integration.

Figure 9:
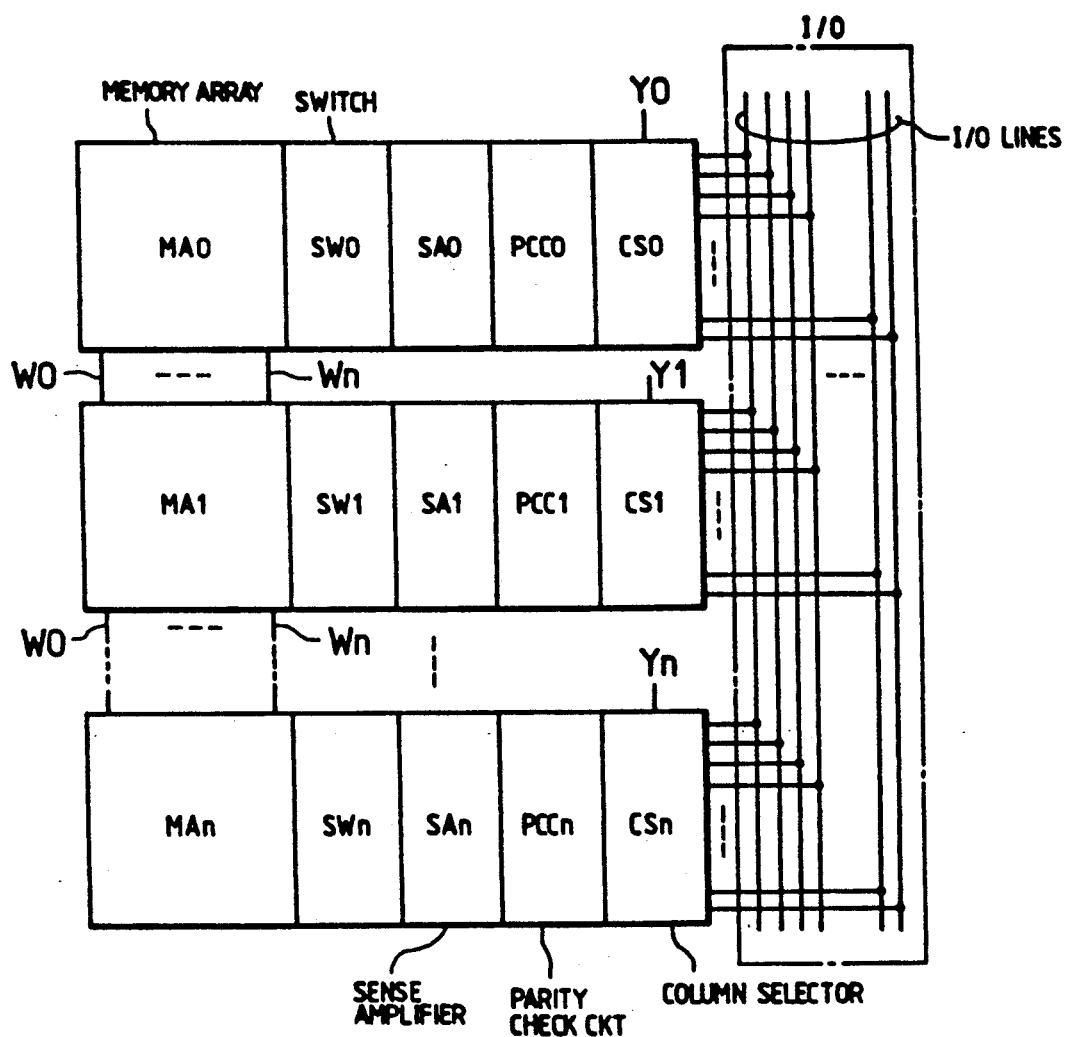
FIG. 9 is a block diagram of a memory constituted by the embodiments shown in FIGS. 1 to 3.

In the embodiment shown in FIG. 1, data of all memory cells connected to a selected word line among the memory cells in the memory array MAO are read out to the I/O lines via switch SWO, sense amplifier SAO, parity check circuit PCCO and column selector CSO under the on condition. As shown in FIG. 9, the I/O lines are commonly used for a plurality of memory arrays MAO, MA1, — — —, MAn. Switches SW1-SWn, sense amplifiers SA1-SAn, parity check circuits PCC1-PCCn, and column selectors CS1-CSn are provided for the main amplifiers MA1-MAn, respectively. The column selectors CSO, CS1, — — — , CSn are served with select signals YO, Y1, — — — , Yn. Data of a plurality of bits are read out onto the common I/O lines from the corresponding memory array via a column selector that is turned on alternatively. According to this embodiment, a plurality of bits are simultaneously read out with a memory array as a unit. Therefore, the column selector needs to have a function which alternatively selects the memory array. In other words, there is not need of providing a column selector between the memory array and the sense amplifier. Therefore, this resistive component which delays the signal transmission speed can be removed from the signal transmission path which runs from the data lines in the memory array to the input/output nodes of the corresponding sense amplifier. The signal transmitted to the input/output nodes of the sense amplifier is a microsignal before being amplified. With the resistive component removed, therefore, the signal transmission speed can be greatly increased and the data reading operation can be carried out at a higher speed.

Figure 2:
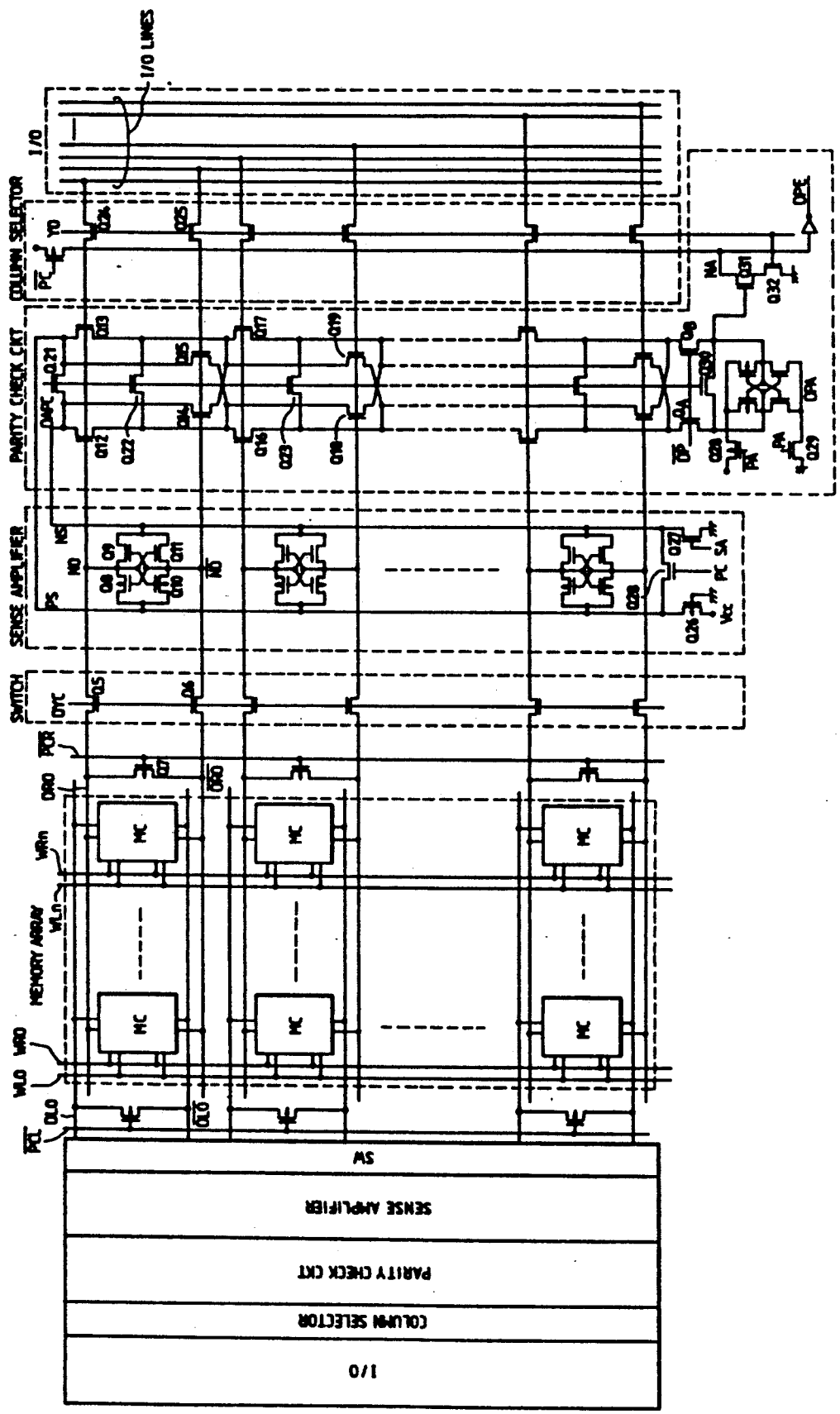
FIG. 2 is a circuit diagram illustrating an essential portion of a RAM according to another embodiment of the present invention.

FIG. 2 is a circuit diagram illustrating major portions of another embodiment of the present invention. In this embodiment, the memory cells have a dual port constitution. That is, each memory cell (MC) has two pairs of transfer gate MOSFETs for selecting an address. Among them, a pair of MOSFETs are connected at their gates to, for example, a word line WRO, and are also connected at their input/output nodes to, for example, complementary data lines DRO, $\overline{DRO}$. Gates of another pair of MOSFETs are connected to a word line WLO, and input/output nodes thereof are connected to complementary data lines DLO, $\overline{DLO}$. Therefore, a memory cell MC is commonly provided at intersecting points of the word line WRO (corresponding to the right port and the complementary data lines DRO, $\overline{DRO}$) and at intersecting points of the word line WLO (corresponding to the left port and the complementary data lines DLO, $\overline{DLO}$).

The sense amplifier, parity check circuit, column selector, and input/output circuit (I/O) which are the same as those of FIG. 1 are provided for the complementary data lines DRO, $\overline{DRO}$ (corresponding to the right port) and for the complementary data lines DLO, $\overline{DLO}$ (corresponding to the left port).

That is, the two input/output ports are symmetrically provided on the right and left sides with the memory array as a center.

In such a dual port RAM, the data is read out by making access to the memory array from the right port as described above. In this case, after the signal read out from a selected memory cell has reached a level necessary for the amplification operation of the sense amplifier, the MOSFETs Q5 and Q6 are turned off by the timing pulse DYC. The time for reading the signal quantity is very short. Therefore, the operation for selecting the word line of the memory array is cleared in parallel with the reading operation by the sense amplifier of the right side. Also, access is made to the memory array from the port of the left side to write or read the data into or out of another address. This helps further increase the speed of operation. Such a dual port RAM leads itself well for a cache memory that will be described later.

Figure 3:
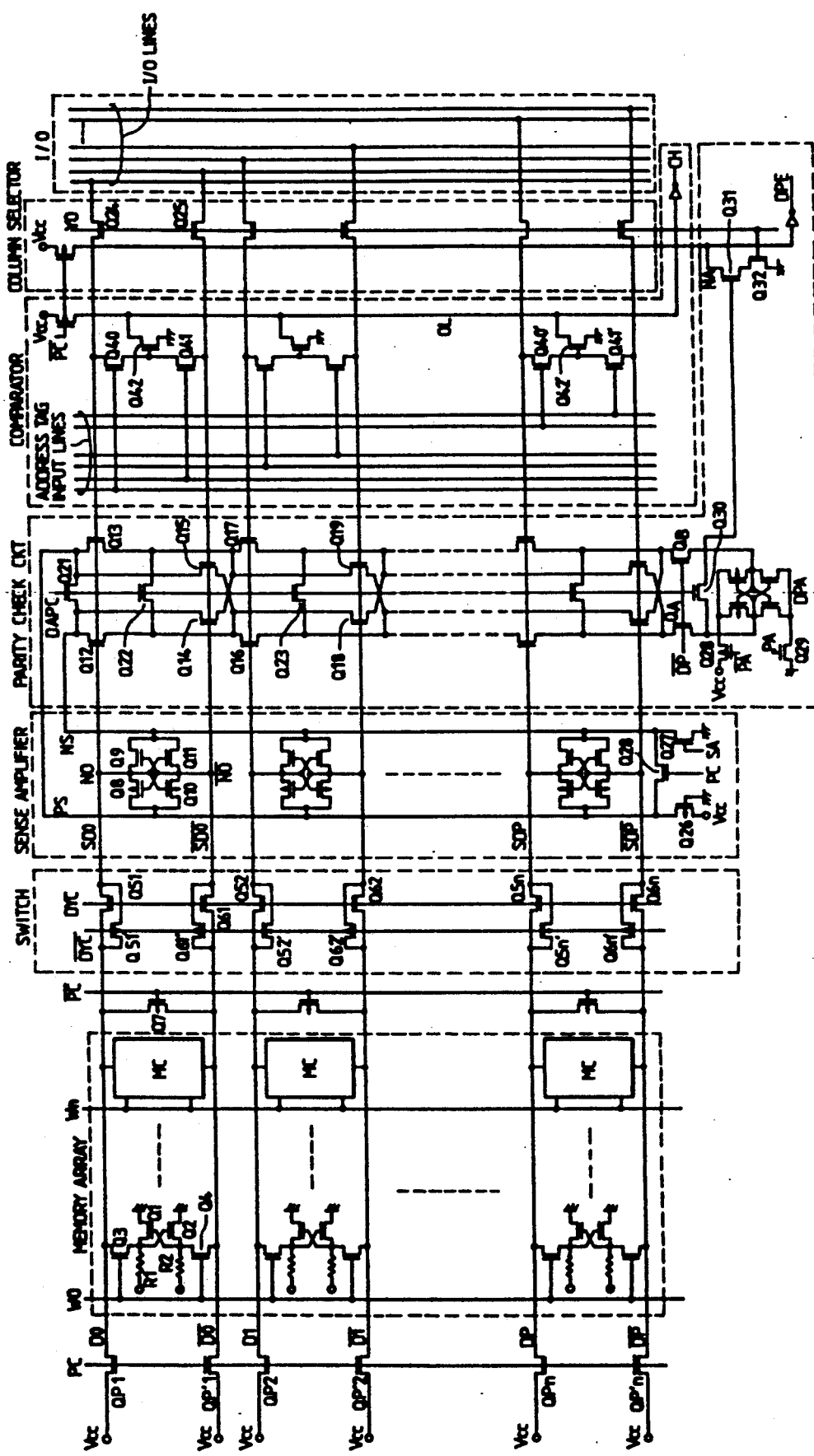
FIG. 3 is a circuit diagram illustrating an essential portion of a RAM according to a further embodiment of the present invention.

FIG. 3 is a circuit diagram illustrating major portions of the RAM equipped with a comparison function.

The RAM of this embodiment is provided with a comparator circuit which compares and detects the coincidence between the data stored in the RAM of the embodiment shown in FIG. 1 and the data sent from an external unit. The memory array, sense amplifier, and parity check circuit are the same as those mentioned earlier and are not described here.

In this embodiment, input/output terminals on the out sides of a pair of MOSFETs (Q40 and Q41) constituting the comparator circuit, are connected to the subcomplementary data lines SDO, $\overline{SDO}$ (which correspond to the complementary data lines DO, $\overline{DO}$). A common connection point of input/output terminals in between the pair of MOSFETs (Q40 and Q41) is connected to the gate of an output MOSFET Q42. The source of the output MOSFET Q42 is connected to ground potential. A pair of MOSFETs and an output MOSFET are connected to other subcomplementary data lines. For instance, a pair of MOSFET's Q40', Q41' and an output MOSFET Q42' are connected to the subcomplementary data lines SDP, $\overline{SDP}$. Drains of the output MOSFET's Q42 and Q42' are commonly connected together. That is, the drain of the output MOSFET Q42 and the like form a wired logic.

Signals to be compared are supplied from an external unit to the gates of the pair of MOSFETs Q40, Q41 that correspond to the subcomplementary data lines SDO, $\overline{SDO}$. For instance, when the RAM of this embodiment is to be utilized for a cache memory, an address tag (that will be described later) is supplied. The external signals corresponding to the stored data are supplied maintaining the complementary level. For instance, when the noninverted subdata line SDO assumes the high level and the inverted subdata line $\overline{SDO}$ assumes the low level (due to the stored data that is read out), the input signal to the gate of MOSFET Q40 is rendered to assume the low level and the input signal to the gate of MOSFET Q41 is rendered to assume the high level by a corresponding signal from the external unit. The external input signal of the high level renders the MOSFET Q41 conductive permitting the low level of the inverted subdata line $\overline{SDO}$ to be transmitted to the gate of the output MOSFET Q42. Therefore, the output MOSFET Q42 is rendered nonconductive.

When the noninverted subdata line SDO assumes the low level and the inverted subdata line $\overline{SDO}$ assumes the high level (due to the stored data that is read out), on the other hand, the input signal to the gate of MOSFET Q40 is rendered to assume the high level and the input signal to the gate of MOSFET Q41 is rendered to assume the low level by a corresponding signal from the external unit. Therefore, the external input signal of the high level renders the MOSFET Q40 conductive permitting the low level of the noninverted subcomplementary data line (SDO) to be transmitted to the gate of the output MOSFET Q42. Therefore, the output MOSFET Q42 is rendered nonconductive. When the whole bits come in agreement as described above, the commonly connected drains are maintained at the high level since the output MOSFETs are all turned off. Therefore, the coincidence detect signal CH assumes the low level.

On the other hand, when the external input signal contains even a bit that is not in agreement with the stored data, the commonly connected drains of the output MOSFETs assume the low level. Therefore, the coincidence detect signal CH assumes the high level.

Figure 8:
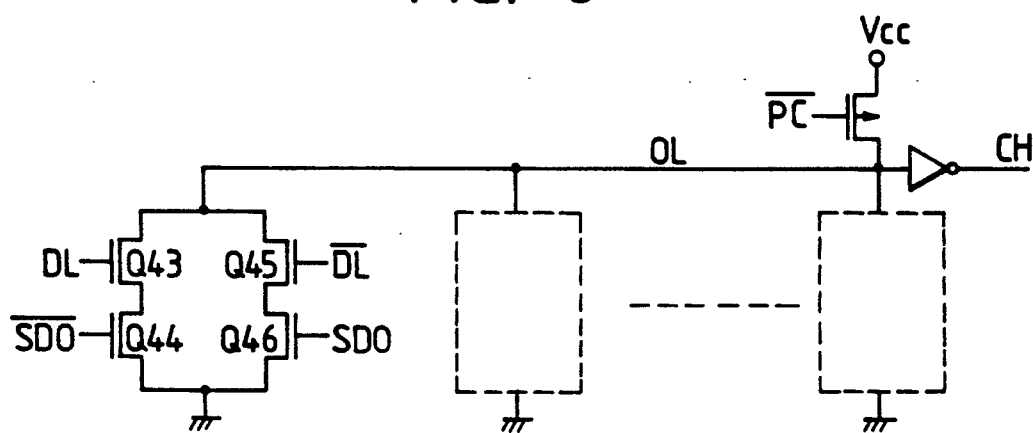
FIG. 8 is a circuit diagram showing a comparator circuit.

It is also allowable to use the circuit shown in FIG. 8 as a comparator circuit. When such a comparator circuit is used, two MOSFETs Q43 and Q45 are coupled to the output line OL per a unit circuit resulting in an increase in the parasitic capacity of the output line OL. Furthermore, the electric charge stored in the output line OL is removed by the two MOSFETs (Q43 and Q44) or (Q45 and Q46) that are connected in series, and the synthetic conductance becomes great. That is, the speed of operation becomes slow and an increased area is occupied.

In the comparator circuit of this embodiment, on the other hand, only one MOSFET is connected to the output line OL, and the parasitic capacity of the output line can be halved if the MOSFET has the size same as that of the MOSFET of FIG. 8. The precharged level of the output line is removed through one output MOSFET. Therefore, if the element has the same size, the conductance can be doubled compared with that of the circuit of FIG. 8. The comparator circuit according to this embodiment makes it possible to greatly increase the speed of operation owing to the decrease in the load capacity and the increase in the discharge current. Furthermore, since the number of MOSFET's is only three per a bit, the occupied area can be decreased, too. The comparator circuit is directly connected to the subcomplementary data lines for which the sense amplifier is provided, and is constituted in the form of an array. Therefore, the signal propagation delay time caused by the turn around of the signal lines is minimized, contributing to increased speed and degree of integration.

In the embodiment of FIG. 3, the switching elements provided between the complementary data lines DO, $\overline{DO}$ to DP, $\overline{SP}$ and the subcomplementary data lines SDO, $\overline{SDO}$ to SDP, $\overline{SDP}$ are constituted by pairs of MOSFETs Q51, Q51' to Q5n, Q5n' and Q61, Q61' to Q6n, Q6n'. The n-channel MOSFETs and p-channel MOSFETs are controlled by the signals DYC, $\overline{DYC}$ of opposite phases. According to this embodiment, the resistance of the switching element is decreased when it is in the on condition. When the switching element is in the on condition, furthermore, there does not develop (between the complementary data lines and the subcomplementary data lines) a voltage that corresponds to a threshold voltage of the MOSFET. It is therefore possible to increase the speed of reading and writing operations and to prevent erroneous operation.

Figure 7:
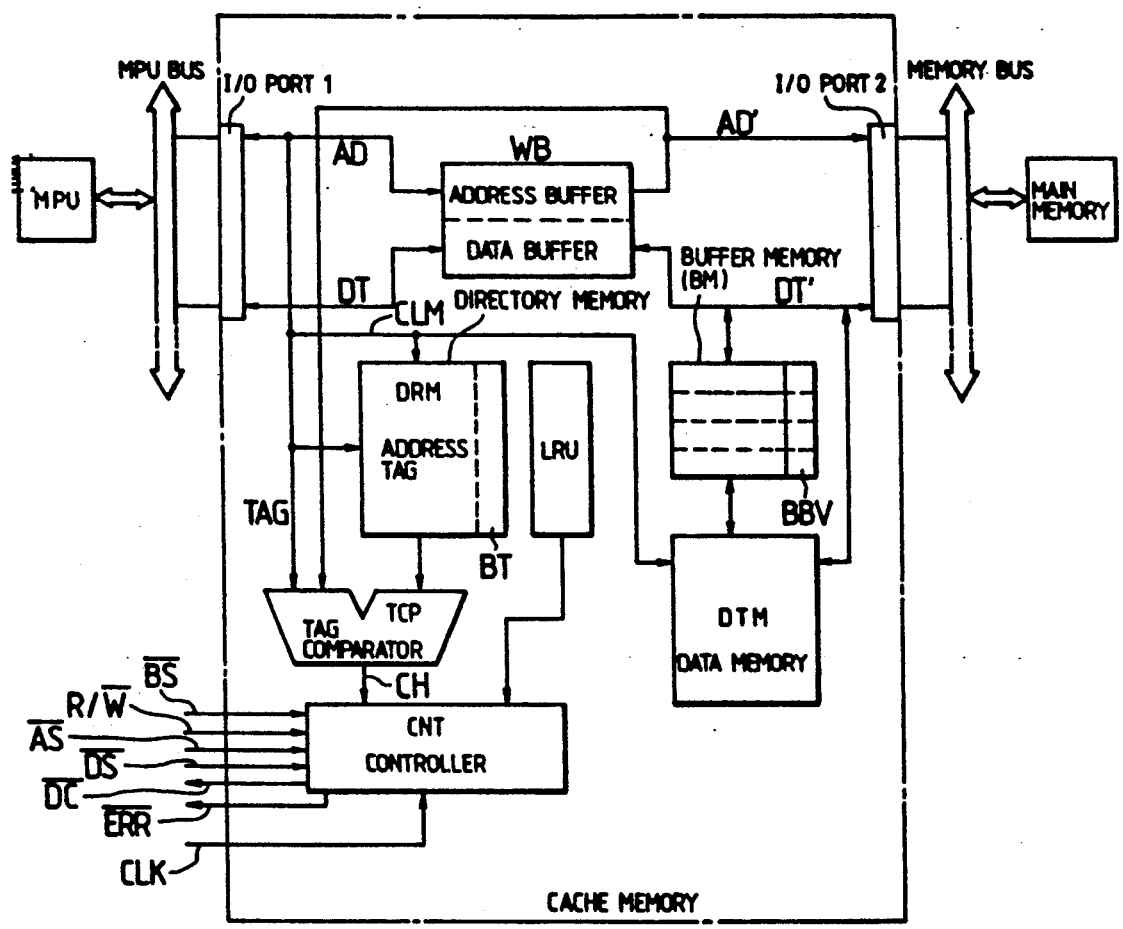
FIG. 7 is a block diagram illustrating an embodiment of a cache memory to which the present invention is adapted.

FIG. 7 is a block diagram of a cache memory to which an embodiment of the present invention is adapted. The cache memory of FIG. 7 can be formed along or together, for example, with a microprocessor on a semiconductor substrate by a known technology for producing semiconductor integrated circuits.

Though not specifically limited, the cache memory consists of a memory portion and a control portion. The memory portion consists of a directory memory DRM, a data memory DTM, a buffer memory BM, and a write buffer WB. The control portion consists of a block-substitution control circuit LRU of the LRU (Least Recently Used) system, a tag comparator circuit TCP and a control circuit CNT that controls these circuits.

The control circuit CNT receives and produces the following control signals: 1) a read/write signal R/W indicating the reading or writing condition, 2) a bus start signal BS indicating the start of a bus cycle, 3) an address strobe signal AS and a data strobe signal DS indicating that there exists an effective address on an address bus and data on a data bus, and CLK denoting a clock signal. These signals are sent from the MPU to the cache memory. Further, the error signal ERR indicates that an error has developed in the cache memory, e.g., an error has developed as a result of checking parity, and the data complete signal DC indicates that the data requested by the MPU is prepared.

The write buffer WB temporarily stores the write address and the write data, and the microprocessor executes the writing operation for the write buffer WB under the write mode. The write mode is finished by the write operation. The internal address bus AD and the internal data bus DT connected to the write buffer WB are also connected to an input/output portion I/O PORT 1 which is then connected to an external bus MPU BUS on the side of the microprocessor MPU. Further, the internal address bus AD' and the internal data bus DT' are connected to an input/output portion I/O PORT 2 that is connected to the external bus MEMORY BUS on the side of the main memory. Therefore, an address signal which makes access to the main memory is transmitted to the main memory via the write buffer. Among the write buffers WB, the data buffer storing the data is also used for the reading operation. The data from the cache memory or the main memory is read, via the data buffer, onto the MPU bus to which the microprocessor is connected. The data buffer functions as a bidirectional bus driver.

The buffer memory BM is used when the data is to be read out from the cache memory or when the data is to be transferred with the block as a unit between the main memory and the cache memory. For example, the data can be transferred between the main memory and the data memory DTM in the cache memory via the buffer memory BM with the block as a unit. At the time of cache hit, one word is selected and output among the data of one block then read onto the buffer memory BM.

The buffer memory BM is constituted of a dual-port register having a port which gives and receives data relative to the main memory and a port which gives and receives data relative to the data memory DTM. A signal path is also provided for the data memory DTM to send the data directly to the internal data bus DT' on the side of main memory. Such a dual port function is realized by the RAM of FIG. 2.

The directory memory (DRM) stores, as an address tag, an address signal of data stored in the same column position of the data memory DTM. The address signal comprises the upper several bits of the address on the main memory. Among the address signals sent from the microprocessor to the address bus AD of the cache memory, the column address portion CLM is supplied to the decoder of the directory memory DRM and the data memory DTM. Therefore, the address tag from the directly memory DRM and the data from the data memory DTM are produced simultaneously. Among them, the data of one block is read out at one time from the data memory DTM and is transferred to the buffer memory BM.

The address tag read out from the directly memory DRM is fed to one input of the tag comparator circuit TPC which is also served through its other input with another address TAG. That tag is a portion of the addresses AD given from the side of the microprocessor. Therefore, as soon as an address tag is produced from the directory memory DRM, the tag comparator circuit TCP readily carries out the comparing operation and produces a signal CH which indicates coincidence (cache hit) or noncoincidence (miss hit). In FIG. 7, the tag comparator circuit TCP and the directory memory DRM are represented by separate blocks. Using the RAM of FIG. 3, however, the directory memory DRM and the tag comparator circuit TCP can be formed as a unitary structure or, in other words, the tag comparator circuit TCP can be incorporated in the directory memory DRM.

In the case of cache hit, the data of one word (designated by the least significant two bits of the address) is selected by a selector (not shown) out of the data of one block (that is read out from the corresponding column position in the data memory DTM) and is transferred to the buffer memory BM. The thus selected data is then transmitted to the microprocessor via data bus DT', the data buffer, and data bus DT.

In the case of miss hit, an address signal is transmitted to the memory bus via the internal address bus AD, the address buffer of write buffer WB, and internal address bus AD', whereby access is made to the main memory and the data is read out. The data read out from the main memory is sent to the microprocessor via the memory bus, internal bus DT', the data buffer, and internal bus DT.

When miss hit develops at the time of writing data, access is made to the main memory by the address signal and by the write data held in the write buffer WB. Then, the writing operation is carried out. At this moment, the address and data are stored in parallel in the cache memory.

Though there is no particular limitation, the directory memory DRM is provided with a transfer bit BT for each column to indicate whether the data requested by the microprocessor MPU is being transferred in blocks from the main memory to the cache memory. Further, the buffer memory BM is provided with a bit BBV for each word to indicate whether the data is effective or invalid. The conditions of these bits (BT and BBV) are monitored by the control circuit CNT. When used for controlling the transfer of data, the control circuit CNT rewrites the bits depending upon the transfer of data.

For example, in the case of the cache hit as a result of comparison of tag portions of the addresses given from the microprocessor, the bit BT at the column position is examined. When it is the logic "0", a desired data is in the data memory DTM. Therefore, the actual data of data memory DTM is input to the data buffer via the internal data bus DT', and a cache hit signal is returned to the microprocessor.

When the transfer bit BT has the logic "1" even in the case of cache hit, the desired data is in the buffer memory BM. Therefore, the bit BBV in the buffer memory BM is examined. When it has the logic "1", the word data is input to the data buffer via the internal data bus SDT' and the cache hit signal is returned to the microprocessor. When the bit BBV has the logic "0", the word data in buffer memory (BM) waits until bit BBV assumes the logic "1" due to the transfer of data from the main memory. At the moment when it assumes the logic "1", the word data is input to the data buffer via the internal data bus DT' and the cache hit signal is returned to the microprocessor. At the same time, when it becomes necessary to transfer the blocks, the control circuit CNT sets a corresponding bit BT in the directory memory DRM to the logic "1" and begins to transfer the data. Depending upon the transfer condition, the bit BBV of the buffer memory BM may be set to the logic "1". If this happens, the data in the buffer memory BM is transferred to the main memory or to the data memory DTM at the moment when the bits (BBV) of all word data in the block assumed the logic "1". When the transfer is finished, the bit BBV in the buffer memory and the bit BT in the directory memory DL are reset to the logic "0".

The high speed of operation and high degree of integration are realized by using the RAM of the embodiments of FIGS. 1 to 3 for the memory portion of the cache memory.

The foregoing paragraphs concretely described the invention accomplished by the present inventors through embodiments. The present invention, however, is in no way limited to the above-mentioned embodiments only, but can be modified in a variety of other ways without departing from the gist of the invention. In FIGS. 1 to 3, for example, the MOSFET Q26 that supplied the power source voltage Vcc to the sense amplifier may be one that supplies a timing pulse SA that changes into the low level during the operation period of the sense amplifier. Moreover, the n-channel MOSFET's Q5 and Q6 for separating the input/output nodes and the complementary data lines may be replaced by a CMOS switching circuit which consists of: 1) p-channel MOSFETS; or 2) a p-channel MOSFET and an n-channel MOSFET; or 3) resistance elements having suitable resistances since the input/output nodes of the same amplifier and the complementary data lines should be separated from each other at least capacitively.

The high level and the low level supplied to the parity check circuit may be obtained by using switching MOSFETs that supply the high and low level in place of a common source line (that controls the operation of the sense amplifier). The parity check circuit and the comparator circuit may also receive the signals read from the dynamic memory cells.

The present invention can be extensively used as a semiconductor memory device.

What is claimed is:

1. A method of reading and writing data from and to a memory cell which is connected by a pair of data lines to input/output lines, wherein the memory cell is associated with a sense amplifier connected between the pair of data lines for sensing and amplifying a voltage difference between the pair, a first switching means between the sense amplifier and the memory cell and a second switching means between the sense amplifier and the input/output lines, the method comprising the steps of:

for a reading operation:

opening the second switching means in preparation for the read operation;

as the sense amplifier commences a reading sense operation of a first voltage difference across the data lines, opening the first switching means;

continuing the reading sense operation with the sense amplifier disconnected from both the memory cell and the input/output lines;

a first predetermined time after commencement of the reading sense operation, closing the second switching means to convey a sense amplifier output to the input/output lines; and, for a writing operation:

opening the first switching means in preparation for the writing operation;

closing the second switching means;

commencing a writing sense operation of a second voltage difference across the data lines by the sense amplifier;

continuing the writing sense operation of the voltage difference across the data lines with the sense amplifier disconnected from the memory cell;

a second predetermined time after the commencing of the writing sense operation, closing the first switching means to convey an output of the sense amplifier to the memory cell.

2. The method for reading from and writing and to a memory cell according to claim 1 wherein the memory cell is a static memory cell.

3. The method and apparatus of claim 1, wherein the memory cell is formed on a single crystalline semiconductor substrate with a pair of cross coupled N-channel mosfets and a pair of polysilicon load elements.

4. The method according to claim 1 further comprising the step of:

turning the sense amplifier on as the first switching means is opened.

5. The method according to claim 1 further comprising the step of:

turning the sense amplifier on before the first switching means is opened.

6. The method according to claim 1 further comprising the step of turning the sense amplifier on after the first switching means is opened and before the second switching means is closed.

7. The method according to claim 1, further comprising the step of:

closing a third switch to convey the data to the input/output lines before closing the second switching means.

* * * * *

UNITED STATES PATENT AND TRADEMARK OFFICE
CERTIFICATE OF CORRECTION

PATENT NO. : 5,193,075

DATED : March 9, 1993

INVENTOR(S) : Susumu Hatano, et al.

It is certified that error appears in the above-identified patent and that said Letters Patent is hereby corrected as shown below:

Claim 2, column 16, line 22, delete the second occurrence of "and".

Signed and Sealed this

Twenty-third Day of November, 1993

Attest:

BRUCE LEHMAN

Attesting Officer     Commissioner of Patents and Trademarks